United States Patent
Marks

[19]

[11] Patent Number: 5,828,328
[45] Date of Patent: Oct. 27, 1998

[54] HIGH SPEED DYNAMIC RANGE EXTENSION EMPLOYING A SYNCHRONOUS DIGITAL DETECTOR

[75] Inventor: Scott Ensign Marks, Penfield, N.Y.

[73] Assignee: Harris Corporation, Melbourne, Fla.

[21] Appl. No.: 671,668

[22] Filed: Jun. 28, 1996

[51] Int. Cl.$^6$ ................................................. H03M 1/18
[52] U.S. Cl. ................................. 341/139; 341/132
[58] Field of Search ............................ 341/132, 138, 341/139, 140

[56] References Cited

U.S. PATENT DOCUMENTS

| | | | |
|---|---|---|---|
| 3,851,309 | 11/1974 | Kenney et al. | 341/139 |
| 4,398,061 | 8/1983 | McMann, Jr. | 333/14 |
| 4,947,133 | 8/1990 | Thomas | 307/264 |
| 5,343,200 | 8/1994 | Matsui | 341/139 |
| 5,631,647 | 5/1997 | Yamada et al. | 341/138 |

FOREIGN PATENT DOCUMENTS 2 210 741  6/1989  United Kingdom ............ H03M 1/18

*Primary Examiner*—Howard L. Williams
*Attorney, Agent, or Firm*—Rogers & Killeen

[57] ABSTRACT

An high speed apparatus and method for extending a dynamic range of a signal processing device which receives an analog input signal. A peak indicator uses a 90° phase shifter and zero crossing detector to indicate when the analog input signal is at a peak amplitude within each of its cycles, and an analog to digital converter (ADC) samples input signal amplitude when each peak amplitude is indicated to provide a digital control word for each sampled peak. A gain controller adjusts the gain of the analog input signal provided to the signal processing device in response to the digital word. Preferably the ADC calculates $\log_2$ of the sampled peak amplitude so that the digital word is a power-of-two operator, the gain controller compresses the analog input signal by a factor of one over the power-of-two, and the output signal from the signal processing device is thereafter expanded by a data shifter which shifts the output by an amount corresponding to the power-of-two.

19 Claims, 1 Drawing Sheet

HIGH SPEED DYNAMIC RANGE EXTENSION EMPLOYING A SYNCHRONOUS DIGITAL DETECTOR

BACKGROUND OF THE INVENTION

The present invention relates to extension of a dynamic range of a signal processing device, and more particularly to a high speed method and apparatus which uses a synchronous digital detector to extend the dynamic range of the signal processing device.

The dynamic range of an analog signal is the difference between the peaks of the signal amplitude. Signal processing devices typically have a maximum dynamic range they will accept in an incoming signal, and if the dynamic range of the incoming signal exceeds the maximum the dynamic range of the incoming signal must be adjusted. The dynamic range of the incoming signal is adjusted by varying the gain of the signal being input to the signal processing device (e.g., compressing the range of the signal) and varying the gain of the output signal from the signal processing device by an inverse amount (e.g., extending the range of the signal) to restore the output signal amplitude.

The problem addressed herein is the determination of the gain adjustment at high speed so as to make the method and apparatus suitable for processing intermediate frequencies (IF) in communication systems, particularly receivers employing IF digitizing and digital signal processing. More particularly, the signal processing device for which the present invention will find application is an analog to digital converter (ADC) for such communication systems.

Various prior art systems for controlling dynamic range are available, but none provide the requisite speed and the accuracy needed for communication system digital signal processing. Such systems detect input signal peaks and provide a gain control signal to an input signal gain controller whereby the dynamic range of the input signal is compressed to fit the signal processing device. See, for example, U.S. Pat. No. 5,194,865 to Mason, et al. and U.S. Pat. No. 4,827,191 to Chapman.

Accordingly, it is an object of the present invention to provide a novel method and apparatus for extending a dynamic range of a signal processing device to which an analog input signal is provided which is suitable for communication system signal processing and thereby obviates the problems of the prior art.

It is another object of the present invention to provide a novel method and apparatus for extending a dynamic range of a signal processing device in which a 90° phase shifter and zero crossing detector indicate when an analog input signal is at a peak amplitude within each of its cycles and in which an ADC samples the amplitude of the input signal when each peak amplitude is indicated.

It is yet another object of the present invention to provide a novel method and apparatus for extending a dynamic range of a signal processing device in which a 90° phase shifter, a zero crossing detector and an ADC are cooperatively operated to form a synchronous digital detector which updates dynamic range with each cycle.

It is still another object of the present invention to provide a novel method and apparatus for extending a dynamic range of a signal processing device in which a synchronous digital detector provides a digital word indicating how a gain of the analog input signal is to be changed responsive to each sampled peak amplitude.

It is a further object of the present invention to provide a novel method and apparatus for extending a dynamic range of a signal processing device in which a dynamic range controller calculates $\log_2$ of a sampled peak amplitude so that a digital word provided to an input signal gain controller is a power-of-2 operator.

It is yet a further object of the present invention to provide a novel method and apparatus for extending a dynamic range of a signal processing device in which a dynamic range controller provides a power-of-two digital control word to an input signal gain controller to thereby compress the analog input signal by a factor of one over the power-of-two of the digital word.

It is still a further object of the present invention to provide a novel method and apparatus for extending a dynamic range of a signal processing device in which a dynamic range controller provides a power-of-two digital control word to an output signal gain controller which is a data shifter for expanding the output signal by shifting it an amount corresponding to the power-of-two of the digital word.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
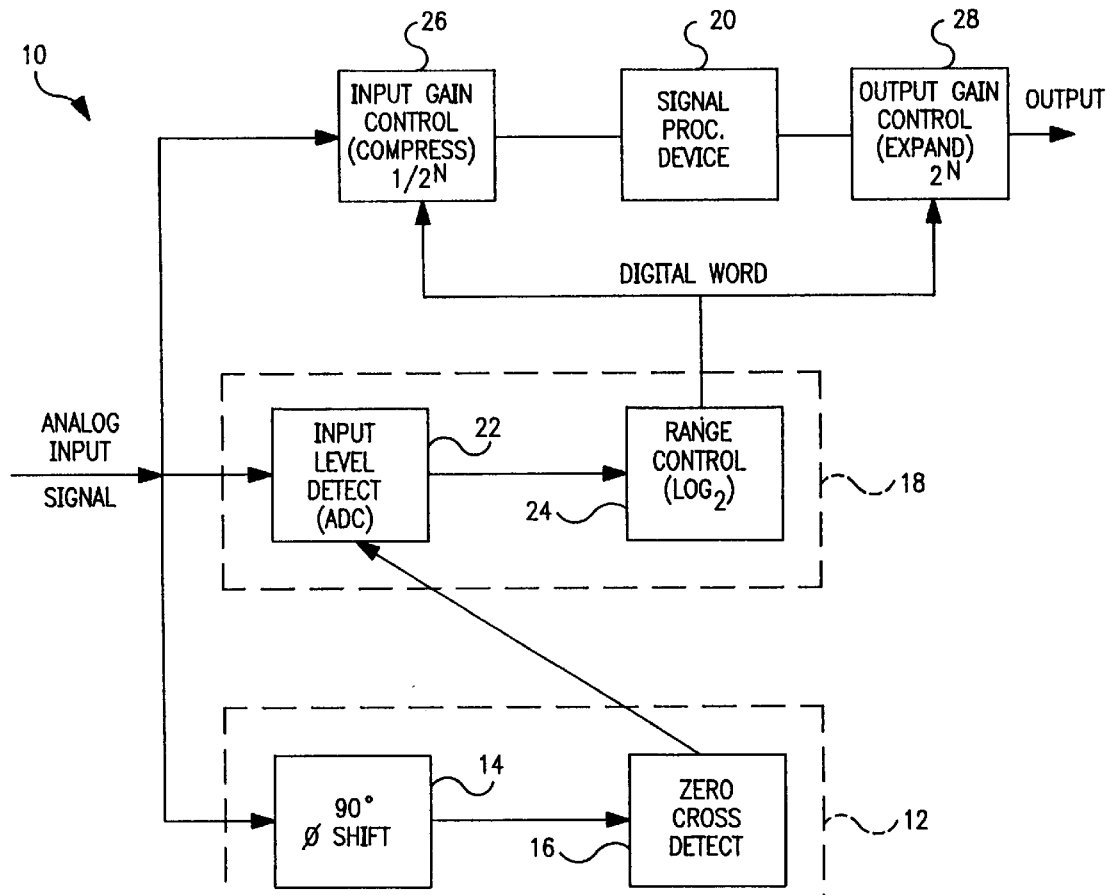
FIG. 1 is a block diagram of an embodiment of the present invention.

With reference now to FIG. 1, an embodiment 10 of the dynamic range extension apparatus of the present invention may include a synchronous digital detector comprised of a peak indicator 12 and an input level detector 18 for providing a digital signal indicating how the gain of the input signal is to be varied to match the desired dynamic range.

Peak indicator 12 may receive an analog input signal and may include a 90° phase shifter 14 and zero crossing detector 16 for indicating that the analog input signal is at a peak amplitude within each of its cycles when a 90° phase shifted input signal crosses zero in a first direction. Input level detector 18 may also receive the analog input signal and samples its amplitude when each peak amplitude is indicated by peak indicator 12.

Input level detector 18 provides a gain control signal, such as a digital word, indicating how a gain of the analog input signal is to be changed responsive to each sampled peak amplitude before the analog input signal is provided to a signal processing device 20. Input level detector 18 may include an analog to digital converter (ADC) 22 which samples the analog input and provides a digital output to a range controller 24 for providing the digital word. An input gain controller 26 also may receive the analog input signal and is for adjusting the gain of the analog input signal provided to signal processing device 20 responsive to the digital word.

In operation, the analog input signal is fed to each of peak detector 12, input level detector 18 (these two elements forming the entitled synchronous digital detector) and input gain controller 26. Peak detector 12 determines when a peak amplitude occurs for each cycle of the input signal and indicates to input level detector 18 that the amplitude of the input signal is to be sampled at each peak. The sampled amplitude may be a digital gain control signal, a digital word, which is provided to input gain controller 26 to adjust the gain of the input signal responsively. In this manner the dynamic range of device 20 is dynamically extended.

Figure 2:
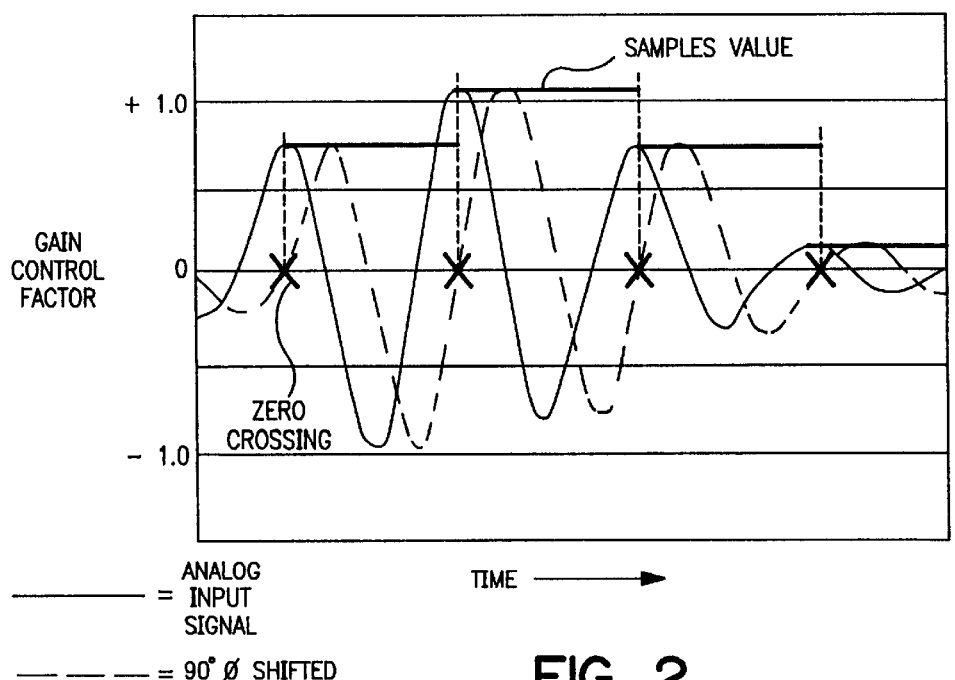
FIG. 2 is a graph illustrating operation of the present invention.

As illustrated in FIG. 2, 90° phase shifter 14 delays the input signal about 90° and zero crossing detector 16 detects the zero crossings of the phase shifted signal (the analog input signal is the solid line and the phase shifted signal is the dashed line in FIG. 2, with the zero crossings being marked with an X.) At each zero crossing the input signal amplitude is sampled (with the darker horizontal lines in FIG. 2 indicating the sampled values.) The sampled values are updated each cycle of the input signal (e.g., at the carrier signal rate) so that peak amplitude values are updated at a rate which is suitable for communication system digital signal processing.

The components shown in FIG. 1 may be conventional and may be in part of a new signal processing system or may be added to an existing system to extend the dynamic range of an existing signal processing device 20. As will be appreciated by those of skill in the art, the components of FIG. 1 do not consume much power and in all probability will require less power and cost less than a new signal processing device which already has the requisite dynamic range. In other words, the present invention affords an option of upgrading an existing signal processing device which will probably be cheaper and consume less power than replacing the device.

In a further embodiment, and with further reference to FIG. 1, the digital word from input level detector 18 may also be provided to an output gain controller 28 which restores the input signal amplitude. That is, output gain controller 28 would apply a correction that is the inverse of that applied by input gain controller 26.

In a preferred and particularly economical embodiment, output gain controller 28 may be a simple data shifter which operates with powers-of-two. In this embodiment, range controller 24 may calculate the $\log_2$ of the digital output from ADC 22 so that the digital word being provided to gain controllers 26 and 28 is a power-of-two operator. Thus, input gain controller 26 may compress the input gain by powers-of-two (e.g., 1, ½, ¼, ⅛, etc.) and output gain controller 28 may expand the output from signal processing device 20 simply by range shifting a corresponding amount (e.q., 1, 2, 4, 8, etc.)

In a further embodiment, gain controllers 26 and 28 may change gain by an amount which is directly proportional to the digital word. In this embodiment, input gain controller 26 may be a multiplying digital to analog converter (MDAC) and output gain controller 28 may be a digital multiplier. The output from ADC 22 may be compared to a reference in range controller 24 so that the digital word provides a continuum of possible multipliers for use by input gain controller 26.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. An apparatus for extending a dynamic range of a signal processing device to which an analog input signal is provided, the apparatus comprising:

a peak indicator for receiving the analog input signal and comprising a 90° phase shifter and zero crossing detector for indicating that the analog input signal is at a peak amplitude within each of its cycles when a 90° phase shifted input signal crosses zero in a first direction;

an analog to digital converter (ADC) for receiving the analog input signal and sampling its amplitude when each peak amplitude is indicated by said peak indicator and for providing a digital word indicating how a gain of the analog input signal is to be changed responsive to each sampled peak amplitude before the analog input signal is provided to the signal processing device; and first gain control means for receiving the analog input signal and adjusting the gain of the analog input signal provided to the signal processing device responsive to the digital word.

2. The apparatus of claim 1 wherein said ADC comprises a range controller for calculating $\log_2$ of the sampled peak amplitude so that the digital word is a power-of-two operator.

3. The apparatus of claim 2 wherein said first gain control means is for compressing the analog input signal by a factor of one over the power-of-two of the digital word.

4. The apparatus of claim 3 wherein the signal processing device provides a digital output, and further comprising a data shifter for receiving the digital output from the signal processing device and for expanding the digital output signal by shifting it an amount corresponding to the power-of-two of the digital word.

5. The apparatus of claim 1 further comprising a second gain control means for receiving an output from the signal processing device and adjusting a gain of the output signal inversely to the gain adjustment of said first gain control means in response to the digital word.

6. The apparatus of claim 5 wherein said first gain control means comprises a multiplying digital to analog converter and said second gain control means comprises a digital multiplier.

7. The apparatus of claim 1 wherein the digital word is the sampled peak amplitude.

8. The apparatus of claim 7 wherein said first gain control means is further for adjusting the gain of the analog input signal in direct proportion to the digital word.

9. The apparatus of claim 1 wherein said ADC comprises a range controller for comparing the sampled peak amplitude to a reference and for providing the digital word responsive to the comparison.

10. The apparatus of claim 1 wherein the signal processing device is one of an analog to digital converter and a communication signal receiver.

11. An apparatus for extending a dynamic range of a signal processing device to which an analog input signal is provided and which provides a digital output signal, the apparatus comprising:

a peak indicator for receiving the analog input signal and for indicating when the analog input signal is at a peak amplitude within each of its cycles; an analog to digital converter (ADC) for receiving the analog input signal and sampling its amplitude when each peak amplitude is indicated by said peak indicator;

a range controller for calculating $\log_2$ of the sampled peak amplitude from said ADC and for providing a digital word indicating how a gain of the analog input signal is to be changed for each sampled peak amplitude before the analog input signal is provided to the signal processing device, wherein the digital word is a power-of-2 operator; and first gain control means for receiving the analog input signal and for compressing the analog input signal by a factor of one over the power-of-two of the digital word; and a data shifter for receiving the digital output signal from the signal processing device and for expanding the digital output signal by shifting it an amount corresponding to the power-of-two of the digital word; and wherein said peak indicator comprises a 90° phase shifter and zero crossing detector for indicating that the analog input signal is at a peak amplitude within each of its cycles when a 90° phase shifted input signal crosses zero in a first direction.

12. A method for extending a dynamic range of a signal processing device to which an analog input signal is provided, the method comprising the steps of:

(a) indicating for each cycle of the analog input signal when a peak amplitude occurs by phase shifting the analog input signal 90° and detecting a zero crossing of the phase shifted input signal, wherein the zero crossing in a first direction occurs when the amplitude peaks;

(b) sampling an amplitude of the analog input signal with an analog to digital converter (ADC) when each peak amplitude is indicated;

(c) providing a digital word for each of the sampled amplitudes which indicates how a gain of the analog input signal is to be changed responsive to each sampled peak amplitude before the analog input signal is provided to the signal processing device; and (d) adjusting a gain of the analog input signal provided to the signal processing device responsive to the digital word.

13. The method of claim 12 further comprising the step of calculating $\log_2$ of the sampled peak amplitude so that the digital word is a power-of-2 operator.

14. The method of claim 13 further comprising the step of compressing the analog input signal by a factor of one over the power-of-two of the digital word.

15. The method of claim 14 wherein the signal processing device provides a digital output, and further comprising the step of for expanding the digital output signal by shifting it an amount corresponding to the power-of-two of the digital word.

16. The method of claim 12 further comprising the step of adjusting a gain of an output signal from the signal processing device inversely to the input signal gain adjustment and in response to the digital word.

17. The method of claim 12 further comprising the step of making the digital word the same as the sampled peak amplitude.

18. The method of claim 17 further comprising the step of adjusting the gain of the analog input signal in direct proportion to the digital word.

19. The method of claim 12 further comprising the step of comparing the sampled peak amplitude to a reference and providing the digital word responsive to the comparison.

* * * * *